(12) United States Patent
Cha et al.

(10) Patent No.: US 11,289,632 B2
(45) Date of Patent: Mar. 29, 2022

(54) LIGHT EMITTING DIODE DISPLAY APPARATUS

(71) Applicant: SAMSUNG ELECTRONICS CO., LTD., Suwon-si (KR)

(72) Inventors: Kyung Hoon Cha, Suwon-si (KR); Won Yong Lee, Suwon-si (KR); Won Soon Park, Suwon-si (KR); Jung-Hoon Yoon, Suwon-si (KR); Tack Mo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/768,424

(22) PCT Filed: Nov. 21, 2018

(86) PCT No.: PCT/KR2018/014310
§ 371 (c)(1),
(2) Date: May 29, 2020

(87) PCT Pub. No.: WO2019/107825
PCT Pub. Date: Jun. 6, 2019

(65) Prior Publication Data
US 2020/0388731 A1      Dec. 10, 2020

(30) Foreign Application Priority Data

Nov. 29, 2017    (KR) .................. 10-2017-0161215

(51) Int. Cl.
*H01L 33/52*    (2010.01)
*H01L 25/075*   (2006.01)
*H01L 33/60*    (2010.01)

(52) U.S. Cl.
CPC .......... *H01L 33/52* (2013.01); *H01L 25/0753* (2013.01); *H01L 33/60* (2013.01)

(58) Field of Classification Search
CPC .................................................. H01L 51/5284
See application file for complete search history.

(56) References Cited

U.S. PATENT DOCUMENTS

| | | | | |
|---|---|---|---|---|
| 2003/0127656 A1* | 7/2003 | Aizawa | ............... | H01L 51/5281 257/79 |
| 2009/0279168 A1* | 11/2009 | Hiwatashi | ............... | C09J 11/06 359/359 |

(Continued)

FOREIGN PATENT DOCUMENTS

| | | |
|---|---|---|
| EP | 2858064 A2 | 4/2015 |
| JP | 2002-6103 A | 1/2002 |

(Continued)

OTHER PUBLICATIONS

Communication dated Nov. 12, 2020 issued by the European Patent Office in application No. 18884398.1.

(Continued)

*Primary Examiner* — Jay C Chang
*Assistant Examiner* — Mikka Liu
(74) *Attorney, Agent, or Firm* — Sughrue Mion, PLLC

(57) ABSTRACT

Provided is a display apparatus including a substrate, a plurality of light emitting device (LED) elements arranged in front of the substrate, a transmission layer formed on a front surface of the substrate to entirely cover the plurality of LED elements, a first polarization member arranged in front of the transmission layer, and a second polarization member arranged on a front surface of the first polarization member and allowing external light to be incident thereon, wherein the transmission layer is provided such that polarization of external light polarized through the second polarization member and the first polarization member is maintained in a course of the polarized external light passing through the transmission layer, being reflected by the front (Continued)

surface of the substrate or the plurality of LED elements and being directed to the first polarization member.

14 Claims, 9 Drawing Sheets

(56) References Cited

U.S. PATENT DOCUMENTS

| | | |
|---|---|---|
| 2011/0164210 A1 | 7/2011 | Tsuda |
| 2017/0301724 A1 | 10/2017 | Lee |
| 2018/0241008 A1 | 8/2018 | Kang et al. |
| 2019/0079338 A1* | 3/2019 | Liu .................... G02F 1/0136 |

FOREIGN PATENT DOCUMENTS

| | | |
|---|---|---|
| KR | 10-2013-0067593 A | 6/2013 |
| KR | 10-2014-0081653 A | 7/2014 |
| KR | 10-2017-0026959 A | 3/2017 |

OTHER PUBLICATIONS

International Search Report (PCT/ISA/210) dated Mar. 22, 2019 by the International Searching Authority in counterpart International Patent Application No. PCT/KR2018/014310.

Written Opinion (PCT/ISA/237) dated Mar. 22, 2019 by the International Searching Authority in counterpart International Patent Application No. PCT/KR2018/014310.

\* cited by examiner

LIGHT EMITTING DIODE DISPLAY APPARATUS

TECHNICAL FIELD

The disclosure relates to a light emitting diode (LED) display apparatus using an LED panel.

BACKGROUND ART

A display apparatus is a type of an output device that visually displays data information, such as texts and figures, and images.

The display apparatus is divided into a light-emitting type light emitting diode (LED) display apparatus using a display panel that emits light itself, such as an LED panel, and a light-receiving type display apparatus using a display panel that does not emit light itself and requires receiving light from a backlight unit, such as a liquid crystal panel.

In the case of a light-emitting type LED display apparatus, when external light is incident on a substrate and LED elements arranged to face a front of the display apparatus, a large portion of the light is reflected, thereby lowing the contrast ratio of an image displayed on the LED display apparatus.

DISCLOSURE

Technical Problem

Therefore, it is an object of the disclosure to provide an LED display apparatus capable of reducing the reflectance of external light reflected on a plurality of LED elements or a substrate.

Technical Solution

According to an aspect of the disclosure, there is provided a LED display apparatus including: a substrate; a plurality of light emitting device (LED) elements arranged in front of the substrate; a transmission layer formed on a front surface of the substrate to entirely cover the plurality of LED elements; a first polarization member arranged in front of the transmission layer; and a second polarization member arranged on a front surface of the first polarization member and allowing external light to be incident thereon, wherein the transmission layer is provided such that polarization of external light polarized through the second polarization member and the first polarization member is maintained in a course of the polarized external light passing through the transmission layer, being reflected by the front surface of the substrate or the plurality of LED elements and being directed to the first polarization member.

The transmission layer may be provided to surround spaces between the plurality of LED elements.

The transmission layer may be configured to cover the plurality of ELD elements on the front surface of the substrate not to generate an air layer between the substrate and the first polarization member.

The transmission layer may have a thickness that is at least equal to a thickness of the plurality of LED elements.

The transmission layer may include an optical adhesive.

The transmission layer may include a light absorbing material.

The transmission layer may have a black color.

The LED display apparatus may further include a low reflection portion arranged on a front surface of the second polarization member, and the low reflection portion is configured to guide external light to be incident on the second polarization member, and prevent the external light incident on the second polarization member and reflected by the front surface of the substrate or the plurality of LED elements from proceeding to an outside of the second polarization member.

The low reflection portion may include a plurality of layers each having a different refractive index of light.

A front most layer of the plurality of layers may include a moth eye pattern.

The LED display apparatus may further include a light absorbing layer arranged between the second polarization member and the low reflection portion, and absorbing at least a portion of the external light passing through the low reflection portion.

The LED display apparatus may further include an optical adhesive layer configured to attach the second polarization member to the low reflection portion and having a black color.

The LED display apparatus may further include an optical adhesive layer configured to attach the first polarization member to the transmission layer and absorb light.

The LED display apparatus may further include a light absorbing thin film coating layer coated on the front surface of the substrate.

The second polarization member may be configured to linearly polarize external light and the first polarization member may be configured to circularly polarize the linear polarization generated by the second polarization member.

According to an aspect of the disclosure, there is provided an LED display apparatus: including an LED display panel that displays an image with light formed by a plurality of LED elements and a housing that covers the LED display panel, wherein the LED display panel includes a substrate including a mounting surface on which the plurality of LED elements are mounted thereon, a linear polarization member forming a front surface of the LED display panel and linearly polarize external light incident on the LED display panel, a circular polarization member arranged on a rear surface of the linear polarization member and circularly polarize the linearly polarized external light, a transmission layer arranged between a rear surface of the circular polarization member and the mounting surface and provided to transmit the external light passing through the circular polarization member, and wherein the transmission layer has a height extending from the mounting surface to the rear surface of the circular polarization member and a height extending from front surfaces of the plurality of LED elements to the rear surface of the circular polarization member that are constant such that the transmission layer completely covers the plurality of LED elements on the mounting surface.

In addition, the transmission layer may be provided such that during a process in which external light polarized through the linear polarization member and the circular polarization member is reflected by the mounting surface or the plurality of LED elements and directed to the circular polarization member, the polarization of the external light is maintained.

In addition, the transmission layer may surround the plurality of LED elements so that no air layer is generated between the mounting surface and the circular polarization member.

In addition, the LED display apparatus may further include a low reflection portion arranged on a front surface of the linear polarization member, and the low reflection portion is configured to guide external light to be incident on the linear polarization member and prevent the external light incident on the linear polarization member and reflected on the front surface of the substrate or the plurality of LED elements from proceeding to the outside of the linear polarization member.

According to an aspect of the disclosure, there is provided an LED display panel including: a substrate, a plurality of LED elements arranged on a surface of the substrate; a transmission layer provided to cover the plurality of LED elements; a first polarization member arranged in front of the transmission layer; and a second polarization member arranged in front of the first polarization member and on which external light is incident, wherein the transmission layer may be provided to cover all spaces between the plurality of LED elements, and when external light is polarized through the second polarization member and the first polarization member, is reflected by the front surface of the substrate or the plurality of LED elements while passing through the transmission layer, and then is linearly polarized by the first polarization member to be transmitted back to pass through the second polarization member, the transmission layer may allow the external light to be blocked by the second polarization member by transmitting the external light only therethrough and maintaining the polarization of the external light during a process in which the external light polarized through the second polarization member and the first polarization member is reflected by the front surface of the substrate or the plurality of LED elements and then is directed to the first polarization member.

Advantageous Effects

As is apparent from the above, the LED display apparatus maintains the polarization of external light reflected between a plurality of polarization members and a substrate on which a plurality of LED elements are mounted, so that the reflected external light is blocked by the plurality of polarization members to reduce the overall reflectance of the external light, thereby improving the contrast ratio of an image displayed on the LED display apparatus.

BEST MODES OF THE DISCLOSURE

Figure 1:
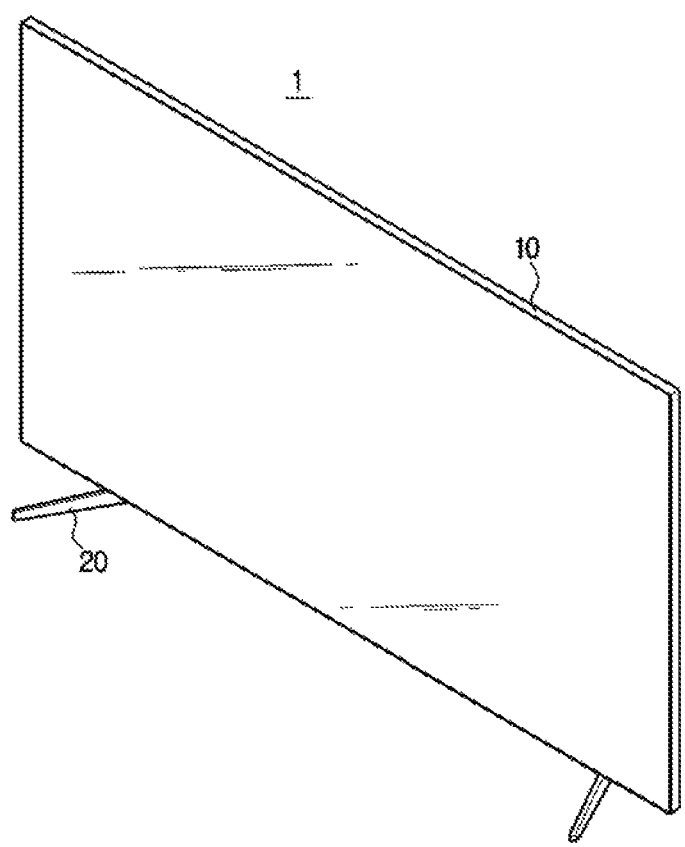
FIG. 1 is a view illustrating an LED display apparatus according to the first embodiment of the disclosure.

The embodiments set forth herein and illustrated in the configuration of the disclosure are only the most preferred embodiments and are not representative of the full technical spirit of the disclosure, so it should be understood that they may be replaced with various equivalents and modifications at the time of the disclosure, which may be included within the spirit and scope of the disclosure as defined by the appended claims.

It is to be understood that the singular forms "a," "an," and "the" include plural references unless the context clearly dictates otherwise. In order to make the description of the disclosure clear, the shapes and sizes of components in the drawings may be exaggerated for clarity.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, the embodiments of the disclosure will be described in detail with reference to the accompanying drawings.

Figure 2:
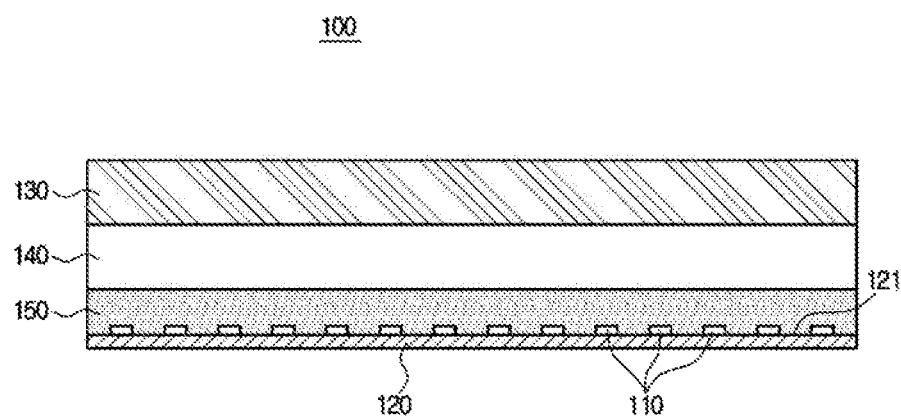
FIG. 2 is a side cross-sectional view illustrating a LED display panel of the LED display apparatus of FIG. 1.
Figure 3:
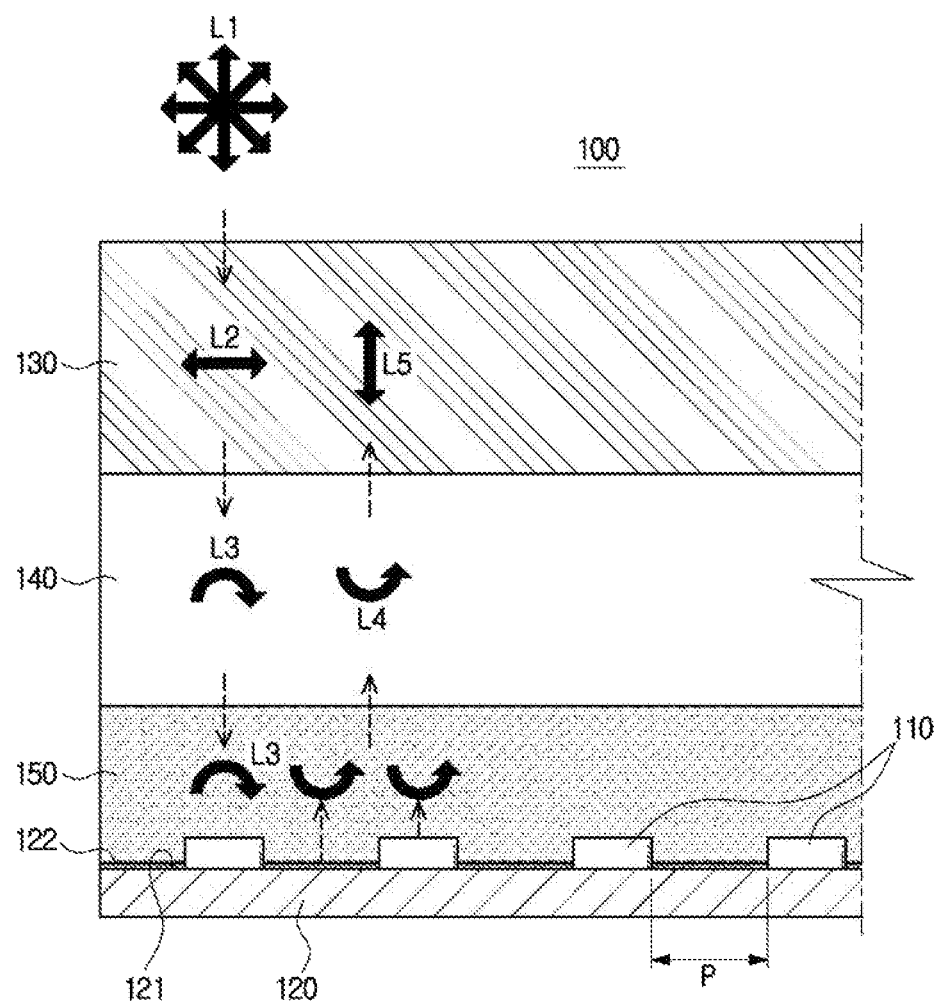
FIG. 3 is an enlarged view illustrating a part of FIG. 2.

FIG. 1 is a view illustrating an LED display apparatus 1 according to the first embodiment of the disclosure, FIG. 2 is a side cross-sectional view illustrating a LED display panel of the LED display apparatus of FIG. 1, and FIG. 3 is an enlarged view illustrating a part of FIG. 2.

The LED display apparatus 1 is an apparatus that displays information, materials, data, and the like in the form of texts, figures, graphs, and images, and may be used for an advertising board, an electronic display board, a screen, a television, a monitor, and the like. The LED display apparatus may be installed on the indoor or outdoor ground by a stand 20 or may be installed on a wall through a wall mount (not shown).

As illustrated in FIG. 1, the LED display apparatus 1 includes an LED display panel 100 on which an image is displayed, a housing 10 covering the LED panel 100, a control board (not shown) for driving the LED display panel 100, and a power supply (not shown) for supplying power to the LED display panel 100. The housing 10 may support the LED display panel 100 and form a part of the external appearance of the display apparatus 1.

The LED display panel 100 is arranged to face the front of the housing 10 and displays an image toward the front. In the present embodiment, the LED display panel 100 has a flat shape, but may have a curved shape or may have a variable curvature.

Referring to FIGS. 2 and 3, the LED display panel 20 may include a plurality of LED elements 110, a substrate 120 on which the plurality of LED elements 110 are mounted, a linear polarization member 130 forming a front surface of the LED display panel 100, and a circular polarization member 140 arranged on a rear surface of the linear polarization member 130.

The substrate 120 may have a shape corresponding to the shape of the LED display apparatus 1, and may be formed of a material, such as glass, polyimide (PI), or FR4.

The substrate 120 may form a mounting surface 121 forming a front surface of the substrate 120 and on which the plurality of LED elements 110 are mounted. A light absorbing thin film coating layer 122 may be coated on a front surface of the mounting surface 121. The light absorbing thin film coating layer 122 may absorb at least a portion of external light introduced into the LED display panel 100 to lower the reflectance of the external light. The light absorbing thin film coating layer 122 may be formed on the entire area of the front surface of the mounting surface 121 or an area of the mounting surface 121 except for an area where the plurality of LED elements 110 are mounted.

The light absorbing thin film coating layer 122 may have a black color. The light absorbing thin film coating layer 122 having a black color is to easily absorb the reflected external light itself, and accordingly, increases the black color reproducibility of the LED display panel 100. In the following description, when external light is referred to as being reflected on the mounting surface 121, the external light may substantially collide with and be reflected on the surface of the light absorbing thin film coating layer 122 provided on the mounting surface 121. However, for the sake of convenience in description, the external light reflected by the light absorbing thin film coating layer 122 will be more inclusively expressed as external light reflected by the mounting surface 121.

The plurality of LED elements 110 may be mounted in a matrix arrangement on the mounting surface 121. Each of the plurality of LED elements 110 may form one pixel. Each of the plurality of LED elements 110 may include a sub-pixel red LED, a sub-pixel green LED, and a sub-pixel blue LED.

The plurality of LED elements 110 are arranged to have a constant distance, and the distance between the LED elements 110 may be variously determined according to the resolution and size of the LED display apparatus 1. For example, in order to display a high-quality image, the LED elements 110 may be reduced in sizes and distances therebetween.

The LED element 110 may be implemented not only with a general lateral-type LED but also with a vertical-type LED or a flip chip having a large emission area to emit light.

In front of the substrate 120, the linear polarization member 130 and the circular polarization member 140 are sequentially disposed from the outside. The linear polarization member 130 may linearly polarize external light incident onto the inside of the LED display panel 100. In detail, non-polarized external light may be changed into linearly polarized light by passing through the linear polarization member 130.

The circular polarization member 140 may change the external light passing through the linear polarization member 130 and maintaining a state of linear polarization into circularly polarized light.

The linear polarization member 130 and the circular polarization member 140 adjust the polarization of external light incident onto the inside of the LED display panel 100 such that incident external light reflected on the plurality of LED elements 110 or the surface of the substrate 120 is restricted from proceeding to the outside of the LED display panel 100 back.

When the external light reflected on the plurality of LED elements 110 or the surface of the substrate 120 proceeds to the outside of the LED display panel 100 back, the reflected light may cause an image to be displayed at a brightness higher than when the image is generated only with light generated by the plurality of LED elements 110. Accordingly, the contrast ratio of the image displayed on the LED display apparatus 1 may be reduced. For example, a representation of a black color displayed on the LED display apparatus 1 may be expressed brighter than a black color represented by the plurality of LED elements 110.

In order to prevent such a limitation, the linear polarization member 130 and the circular polarization member 140 may be provided to restrict external light incident onto the inside of the LED display panel 100 from being reflected back to the outside of the LED display panel 100.

In detail, when non-polarized external light L1 passes through the linear polarization member 130, the linear polarization member 130 may transmit only light having a phase of 0° (alternatively, transmit only light having a phase of 90° without being limited to the embodiment), so that the external light L1 may be changed to linearly polarized light L2 having a phase of 0°.

Thereafter, when the linearly polarized light L2 passes through the circular polarization member 140, the linearly polarized light L2 may be changed into circularly polarized light L3 having a phase of 45° by the circular polarization member 140.

Thereafter, the circularly polarized light L3 passes through a transmission layer 150 (which will be described below), and while maintaining the state of the circular polarization L3, is reflected on the plurality of LED elements 110 and the mounting surface 121 or the light absorbing thin film coating layer 122 coated on the mounting surface 121 and then is incident on the circular polarization member 140 back.

Thereafter, the circularly polarized light L3 may be changed into circularly polarized light L4 having a phase of 90° by the circular polarization member 140.

Thereafter, the circularly polarized light L4 while passing through the linear polarization member 130 may be changed into linearly polarized light L5 having a phase of 90°. However, the linear polarization member 130 transmits only linearly polarized light having a phase of 0° as described above, so that the linearly polarized light L5 reflected from the inside of the LED display panel 100 is blocked without transmitting through the linear polarization member 130, and thus is not reflected to the outside of the LED display panel 100.

Accordingly, external light reflected from the inside of the LED display panel 100 may not proceed to the outside of the display panel 100 so that light other than the light generated by the plurality of LED elements 110 is restricted from being additionally displayed on the LED display panel 100.

The linear polarization member 130 and the circular polarization member 140 need to be arranged in front of the substrate 120 as described above, to reduce the reflectance of light reflected from a side of the substrate 120. In this case, when the linear polarization member 130 and the circular polarization member 140 are arranged on the front surface of the substrate 120, the linear polarization member 130 and the circular polarization member 140 are not easily arranged due to the plurality of LED elements 110 protruding forward of the substrate 120 arranged.

That is, the linear polarization member 130 and the circular polarization member 140 are formed of a surface-shaped film, and the linear polarization member 130 and the circular polarization member are difficult in in coming into close contact with the substrate 120 due to the plurality of LED elements 110 protruding forward of the substrate 120, having difficulty in assembly of the linear polarization member 130 and the circular polarization member 140.

In addition, when the linear polarization member 130 and the circular polarization member 140 are assembled to be arranged in contact with the front surfaces of the plurality of LED elements 110, an air layer may be formed in a space between the plurality of LED elements 110. That is, assuming that there is no transmissive layer 150 in FIG. 3, an air layer may be formed in a space by a pitch P defined as a distance between the respective LED elements 110 and the circular polarization member 140.

In this case, during a process in which a portion of external light passing through the circular polarization member 140 is incident on the air layer and collides with the front surface of the substrate 120 before being reflected back to the circular polarization member 140, the polarization thereof formed by the circular polarization member 140 before the reflection may be changed.

That is, the light passing through the air layer passes through a different medium and thus the polarization of the external light is changed, or the polarized external light additionally collides with the side surfaces of the plurality of LED elements 110, causing scattering, so that the amount of reflected light of the external light to be filtered by the linear polarization member 130 and the circular polarization member 140 is reduced, and thus the efficiency of restricting external light reflection of the linear polarization member 130 and the circular polarization member 140 may be lowered.

As such, it is difficult to substantially reduce the reflectance of external light using the linear polarization member and the circular polarization member arranged on the front surface of the substrate, so that the conventional LED display apparatus does not use the linear polarization member and the circular polarization member as an external light reflection suppression configuration.

In the conventional LED display apparatus, in order to reduce the reflectance of external light, a member having a low-light transmittance is arranged on the front surface of the substrate to restrict external light itself from being introduced toward the substrate. However, when the low transmittance member is arranged on the front surface of the substrate, the efficiency of light displayed on the LED display panel is lowered, and thus the efficiency of the LED display apparatus is lowered and power consumption is increased.

In order to prevent such a limitation, the LED display apparatus 1 according to the embodiment of the disclosure omits the low transmittance member and further includes the transmission layer 150 so that the reflectance of external light through the linear polarization member and the circular polarization member is controlled.

In detail, the transmission layer 150 may be provided to completely cover the plurality of LED elements 110 on the mounting surface 121 of the substrate 120. Accordingly, the air layer formed between the plurality of LED elements 110 may be removed, and the transmission layer 150 may be formed in all the spaces between the plurality of LED elements 110.

The transmission layer 150 may be formed of a material capable of maintaining polarization of light passing through the transmission layer 150. Preferably, the material may include a poly material, such as silicone or epoxy. The transmission layer 150 may be formed by molding such a material. That is, the transmission layer 150 is formed with a poly material coated on the mounting surface 121 that is then molded between the plurality of LED elements 110, so that the air layer formed between the plurality of LED elements 110 may be removed.

Accordingly, during a process in which external light circularly polarized by passing through the circular polarization member 140 passes through the transmission layer 150 and is reflected by the mounting surface 121 or the plurality of LED elements 110 before being directed to the circular polarization member 140 back, the degree of polarization of the polarized external light may be maintained constant inside the transmission layer 150.

That is, the transmission layer 150 may restrict the occurrence of a change in polarization by preventing the external light from passing through an air layer during a process in which the external light is reflected and then directed back to the circular polarization member 140 and the linear polarization member 130. Therefore, the transmission layer 150 may be provided to cover all the spaces between the plurality of LED elements 110.

The thickness of the transmission layer 150, that is, the distance from the mounting surface 121 to the circular polarization member 140 may be formed at least equal to or greater than the thickness of the plurality of LED elements 110.

That is, the transmission layer 150 may be molded on the mounting surface 121 at a height corresponding to those of the front surfaces of the plurality of LED elements 110 such that the transmission layer 150 forms a flat front surface together with the front surfaces of the plurality of LED elements 110, or at a height higher than the front surfaces of the LED elements 110 such that a front surface of the transmission layer 150 includes a flat front surface.

The transmission layer 150 is provided to completely cover the plurality of LED elements 110 on the mounting surface 121 such that a final height extending from the mounting surface 121 to a rear surface of the circular polarization member 140 and a final height extending from the front surfaces of the plurality of LED elements 110 to the rear surface of the circular polarization member 140 are constant. Therefore, the front surface of the transmission layer 150 may be provided in a flat plane.

Therefore, the circular polarization member 140 arranged on the front surface of the transmission layer 150 may be easily arranged on the front surface of the transmission layer 150 through adhesion to the front surface of the transmission layer 150.

As described above, the LED display panel 100 according to the embodiment of the disclosure may suppress the reflectance of external light in combination of the linear polarization member 130 and the circular polarization member 140 through the transmission part 150.

That is, the linear polarization member 130 and the circular polarization member 140 may be easily arranged on the front surface of the substrate 120 through the transmission layer 150 formed on the mounting surface 121, and the polarization of the external light transmitted to the inside of the transmission part 150 via the circular polarization member 14 is maintained, so that the linear polarization member 130 and the circular polarization member 140 may be used as a configuration that reduces the reflectance of external light of the LED display panel 100. Accordingly, the efficiency of the LED display panel 100 may be increased, and the reflectance of external light may be effectively suppressed.

As described above, the transmission layer 150 may cover all of the spaces between the plurality of LED elements 110 or may cover all the front surfaces of the plurality of LEDs 110. Therefore, the transmission layer 150 may protect the plurality of LED elements 110 from external forces.

Particularly, as described above, when the plurality of LED elements 110 are formed of a flip chip, a thin sapphire substrate of the flip chip may be protected by the transmissive layer 150, thereby improving the durability of the display apparatus 1. In the following description, a LED display panel 200 according to another embodiment (the second embodiment) of the disclosure will be described.

Components except for the LED display panel 200 described below are the same as those of the LED display panel 100 according to the previous embodiment (the first embodiment) of the disclosure, and thus details of thereof will be omitted.

Figure 4:
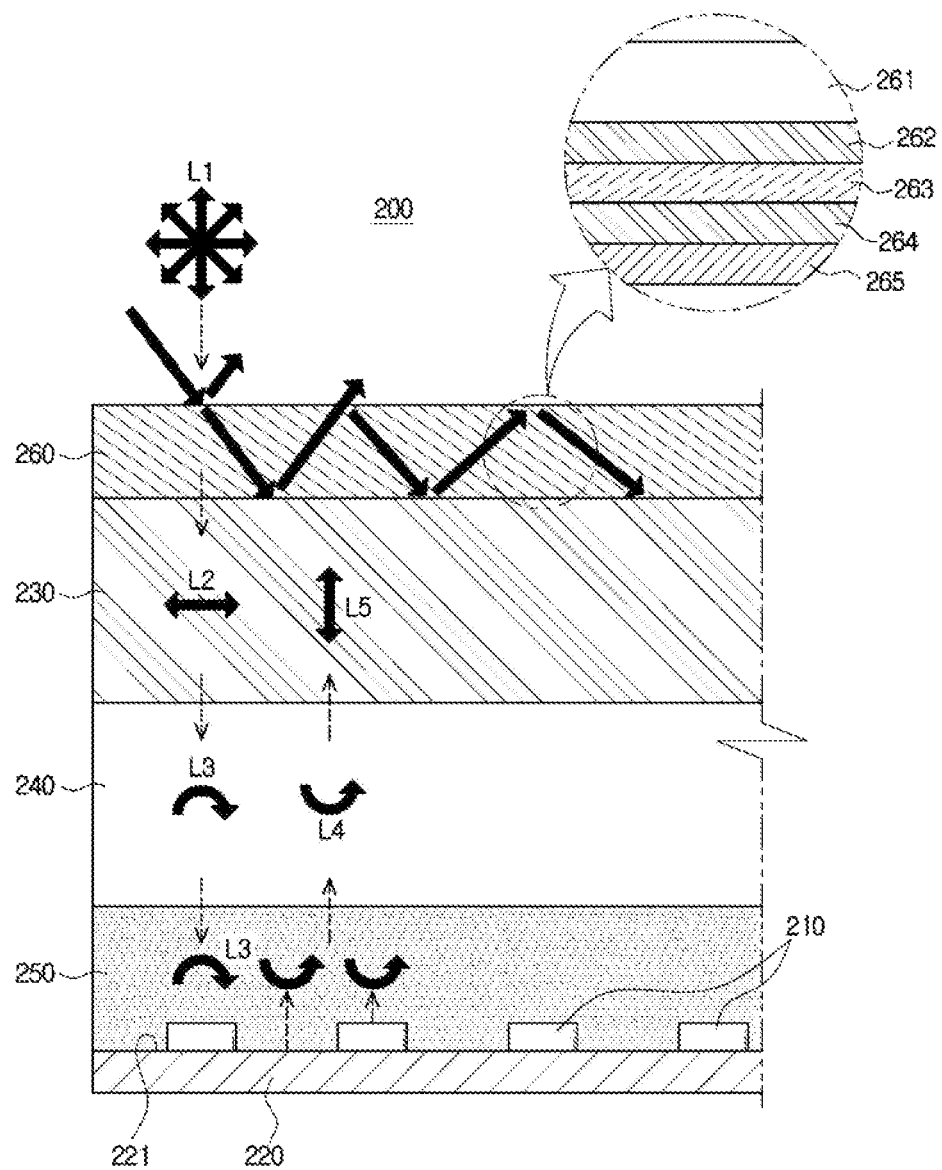
FIG. 4 is a side cross-sectional view illustrating an LED display panel according to the second embodiment of the disclosure.

FIG. 4 is a side cross-sectional view illustrating the LED display panel 200 according to the second embodiment of the disclosure.

The LED display panel 200 includes a plurality of LED elements 210 mounted on a mounting surface 221 of a substrate 220, and on the mounting surface 221, a transmission layer 250, a circular polarization member 240, and a linear polarization member 230 are sequentially stacked in a direction toward the outside.

The LED display panel 200 may further include a low reflection portion 260 arranged on the front surface of the linear polarization member 230. The low reflection portion 260 is provided to maximally transmit external light incident on the LED display panel 200 to a side of the substrate 220 and the plurality of LED elements 210, thereby reducing the reflectance of external light of the LED display panel 200.

The low reflection portion 260 may include a plurality of layers 261, 262, 263, 264 and 265 each having a different refractive index. However, the disclosure is not limited thereto, and the low reflection portion 260 may include layers in a number greater than or less than five.

The plurality of layers 261, 262, 263, 264 and 265 may be provided such that light incident on the LED display panel 200 is maximally transmitted to a side of the substrate 220 or the plurality of LED elements 210 due to a difference in refractive index. That is, external light passing through the layers 261, 262, 263, 264, and 265 is changed in refractive index each time the external light passes through one of the layers 261, 262, 263, 264, and 265, so that the external light is guided to be moved in a direction of the panel only on the plurality of layers 261, 262, 263, 264, and 265. Light that is not incident in the direction of the panel may be lost while moving to the lateral side through internal reflection.

At least a portion of the external light may be subject to internal reflection in the low reflection portion 260 to be directed to the outside, and most of the external light may travel in a direction of the substrate 220 or the plurality of LED elements 210 due to the different refractive indices on the respective layer 261, 262, 263, 264, and 265. In this case, light through internal reflection is lost due to polarization, and the remaining light is guided to the lateral side, so that the contrast ratio may be increased when the display is viewed from the front.

As the external light proceeds in a direction in which each layer 261, 262, 263, 264, and 265 extends, some light is absorbed inside each layer 261, 262, 263, 264, or 265 or proceeds to both ends of the plurality of layers 261, 262, 263, 264, and 265 to be transmitted from both ends of the plurality of layers 261, 262, 263, 264, and 265.

Accordingly, some of the external light incident on the LED display panel 200 is not prevented from proceeding toward the substrate 220 and the plurality of LED elements 210 due to the low reflection portion 260, so that the reflectance of the external light reflected by the substrate 220 and the plurality of LED elements 210 may be further reduced.

Hereinafter, a LED display panel 300 according to another embodiment (the third embodiment) of the disclosure will be described. Components except for the LED display panel 300 described below are the same as the LED display panels 100 and 200 of the previous embodiments (the first and second embodiments) of the disclosure, and thus details of thereof will be omitted.

Figure 5:
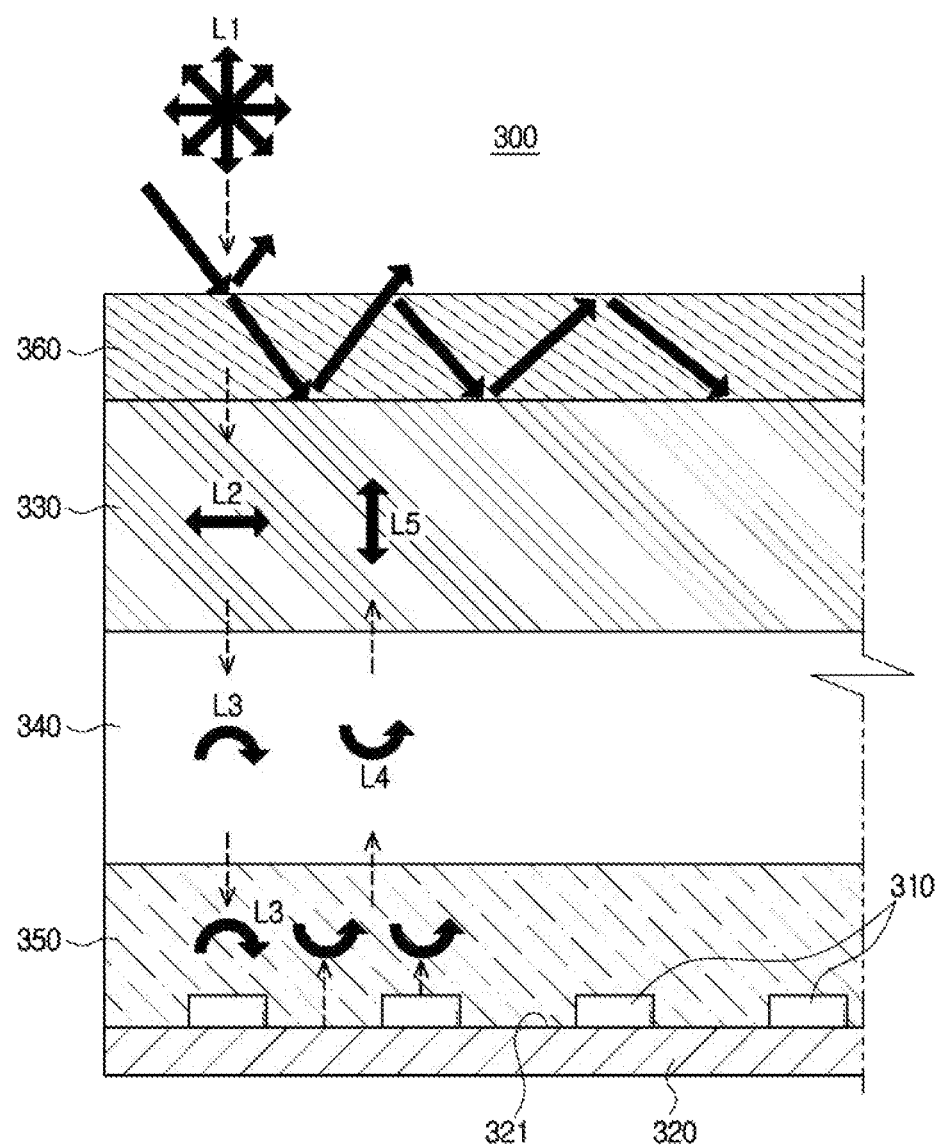
FIG. 5 is a side cross-sectional view illustrating an LED display panel according to the third embodiment of the disclosure.

FIG. 5 is a side cross-sectional view illustrating the LED display panel 300 according to the third embodiment of the disclosure.

The LED display panel 300 includes a plurality of LED elements 310 mounted on a mounting surface 321 of a substrate 320, and on the mounting surface 321, a transmission layer 350, a circular polarization member 340 and a linear polarization member 330 are sequentially stacked in a direction toward the outside. In addition, the LED display panel 300 may include a low reflection portion 360 arranged on a front surface of the linear polarization member 330.

The transmission layer 350 may be formed of an optical adhesive. That is, an optical adhesive formed thicker than the thickness of each of the plurality of LED elements 310 to bond the substrate 320 and the circular polarization member 340 may form an adhesive layer between the substrate 320 and the circular polarization member 340, providing the transmission layer 350.

Because the transmission layer 350 is formed of an optical adhesive, during a process in which the external light polarized by passing through the circular polarization member 340 is reflected by the mounting surface 321 of the substrate 320 or the plurality of LED elements 310 and then is directed back to the circular polarization member 340 back, the polarization of the external light may be maintained.

Hereinafter, a LED display panel 400 according to another embodiment (the four embodiment) of the disclosure will be described. Components except for the LED display panel 400 described below are the same as the LED display panels 100, 200, and 300 of the previous embodiments (the first, second, and third embodiments) of the disclosure, and thus details of thereof will be omitted.

Figure 6:
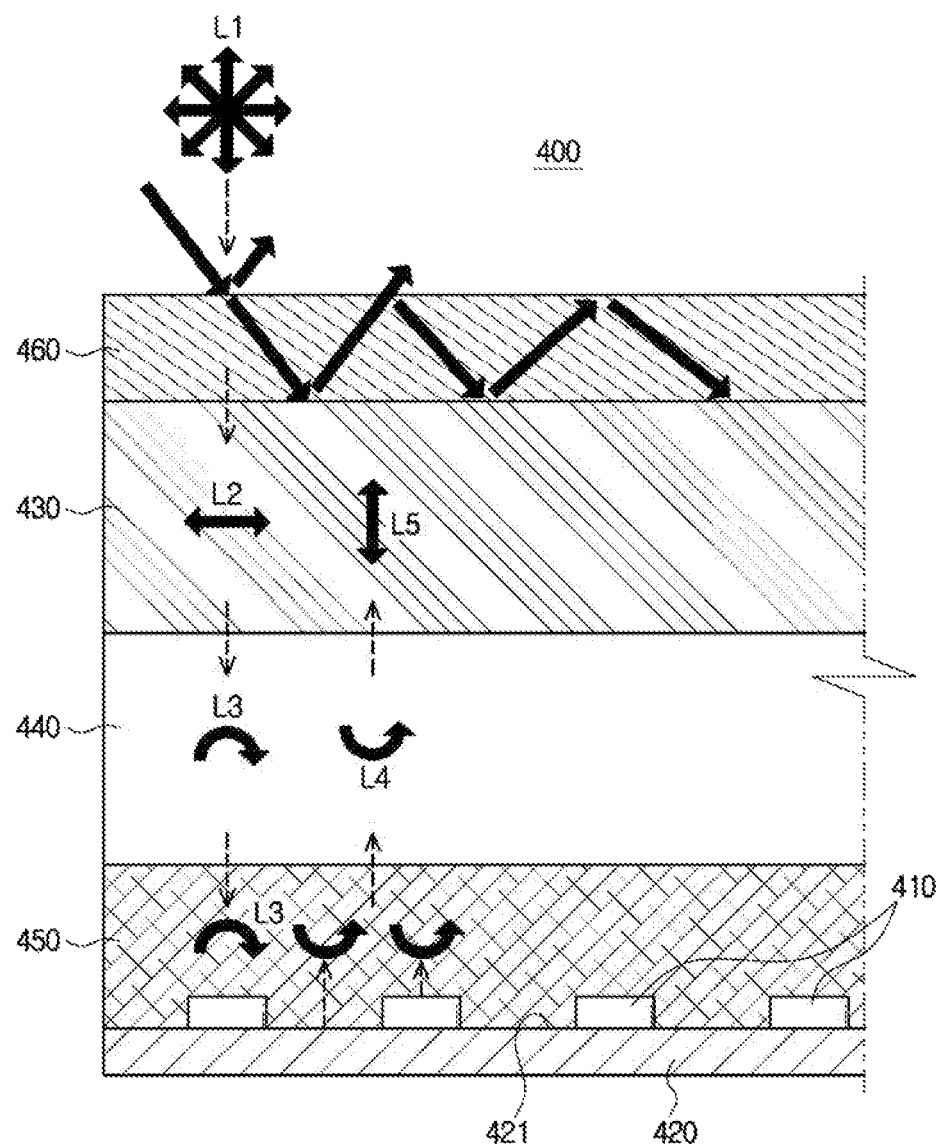
FIG. 6 is a side cross-sectional view illustrating an LED display panel according to the fourth embodiment of the disclosure.

FIG. 6 is a side cross-sectional view illustrating the LED display panel 400 according to the fourth embodiment of the disclosure.

The LED display panel 400 includes a plurality of LED elements 410 mounted on a mounting surface 421 of a substrate 420 and on the mounting surface 421, a transmission layer 450, a circular polarization member 440, and a linear polarization member 430 are sequentially stacked in a direction toward the outside. In addition, the LED display panel 400 may include a low reflection portion 460 arranged on a front surface of the linear polarization member 430.

The transmission layer 450 may be formed of a poly material or an optical adhesive as described above, and may additionally include a light absorbing material. The transmission layer 450 obtained by mixing a poly material or an optical adhesive with a light absorbing material absorbs at least a portion of external light passing through the transmission layer 450 to decrease the amount of light reflected by the substrate 420 or the plurality of LED elements 410.

That is, at least a portion of external light transmitted through the circular polarization member 440 and incident on the transmission layer 450 may be absorbed inside the transmission layer 450, and a portion of the external light reflected by the substrate 420 or the plurality of LED elements 410 and then directed to the circular polarization member 440 may be also absorbed by the transmission layer 450.

Therefore, at least a portion of the external light incident to the inside of the LED display panel 400 is absorbed in the transmission layer 450 and the amount of light reflected to the outside the LED display panel 400 decreases, so that the transmission layer 450 lowers the reflectance of external light.

Hereinafter, a LED display panel 500 according to another embodiment (the fifth embodiment) of the disclosure will be described. Components except for the LED display panel 500 described below are the same as the LED display panels 100, 200, and 300 of the previous embodiments (the first, second, and third embodiments) of the disclosure, and thus details of thereof will be omitted.

Figure 7:
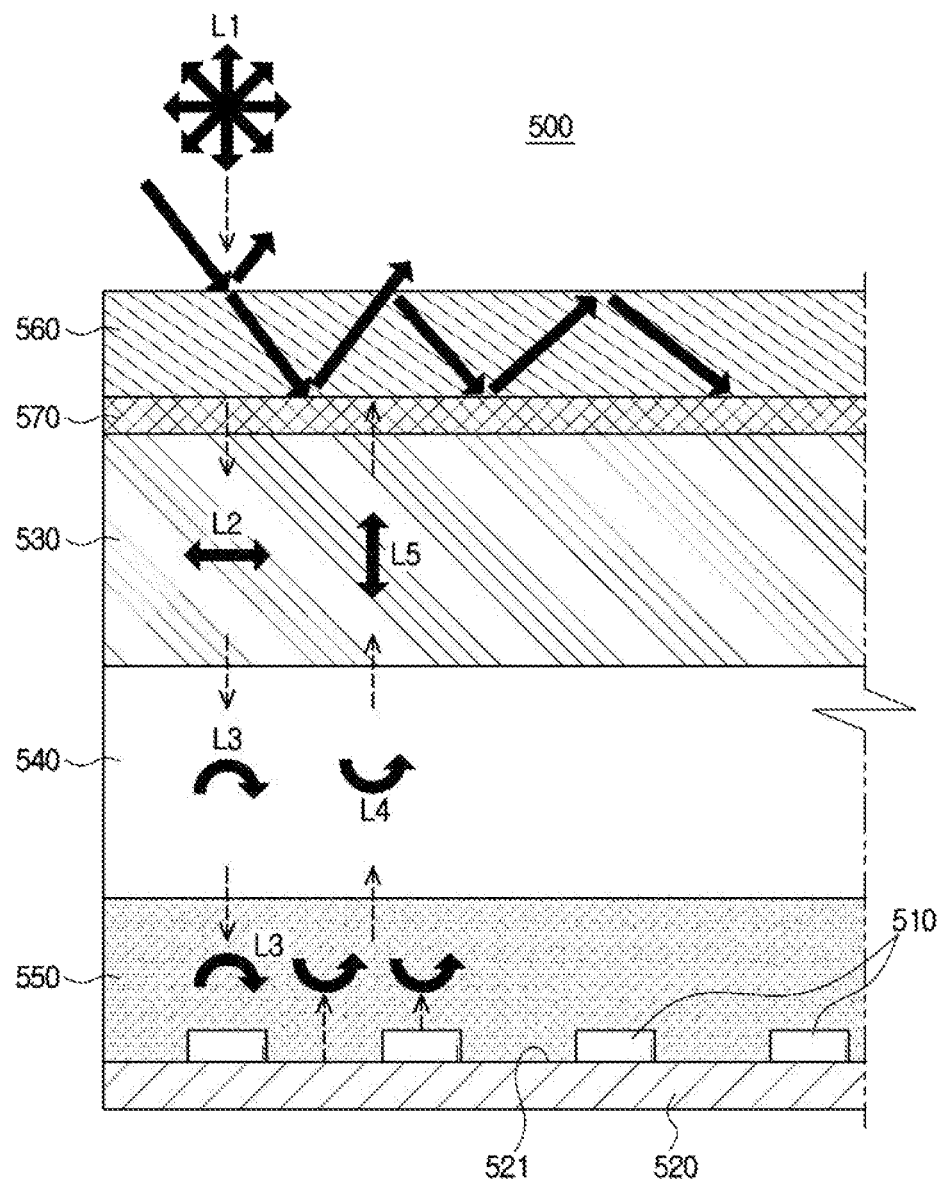
FIG. 7 is a side cross-sectional view illustrating an LED display panel according to the fifth embodiment of the disclosure.

FIG. 7 is a side cross-sectional view illustrating the LED display panel according to the fifth embodiment of the disclosure.

The LED display panel 500 includes a plurality of LED elements 510 mounted on a mounting surface 521 of a substrate 520, and on the mounting surface 521, a transmission layer 550, a circular polarization member 540, and a linear polarization member 530 are sequentially stacked in a direction toward the outside. In addition, the LED display panel 500 may include a low reflection portion 560 arranged on a front surface of the linear polarization member 430.

Additionally, the LED display panel 500 may include a light absorbing layer 570 that absorbs at least a portion of external light incident to the inside of the LED display panel 500.

The light absorbing layer 570 may be formed by coating a light absorbing material on a rear surface of the low reflection portion 560 or an upper surface of the linear polarization member 530. In addition, the light absorbing layer 570 may be formed of a light absorbing film and arranged between the low reflection portion 560 and the linear polarization member 530. Also, the disclosure is not limited thereto, and the light absorbing layer 570 may be arranged between the transmission portion 550 and the circular polarization member 540.

The light absorbing layer 570 may have a black color to facilitate absorption of external light, and preferably may include a black carbon material or the like.

At least a portion of external light transmitted through the low reflection portion 460 and incident on the light absorbing layer 570 may be absorbed inside the light absorbing layer 570, and a portion of the external light reflected by the substrate 420 or the plurality of LED elements 410 and sequentially passing through the circular polarization member 440 and the linear polarization member 430 may be also absorbed by the light absorbing layer 570.

Therefore, at least a portion of external light incident to the inside of the LED display panel 500 is absorbed inside the light absorbing layer 570, and the amount of light reflected to the outside of the LED display panel 500 decreases, so that the transmission layer 570 lowers the reflectance of external light.

Hereinafter, a LED display panel 600 according to another embodiment (the sixth embodiment) of the disclosure will be described. Components except for the LED display panel 600 described below are the same as the LED display panels 100, 200, and 300 of the previous embodiments (the first, second, and third embodiments) of the disclosure, and thus details of thereof will be omitted.

Figure 8:
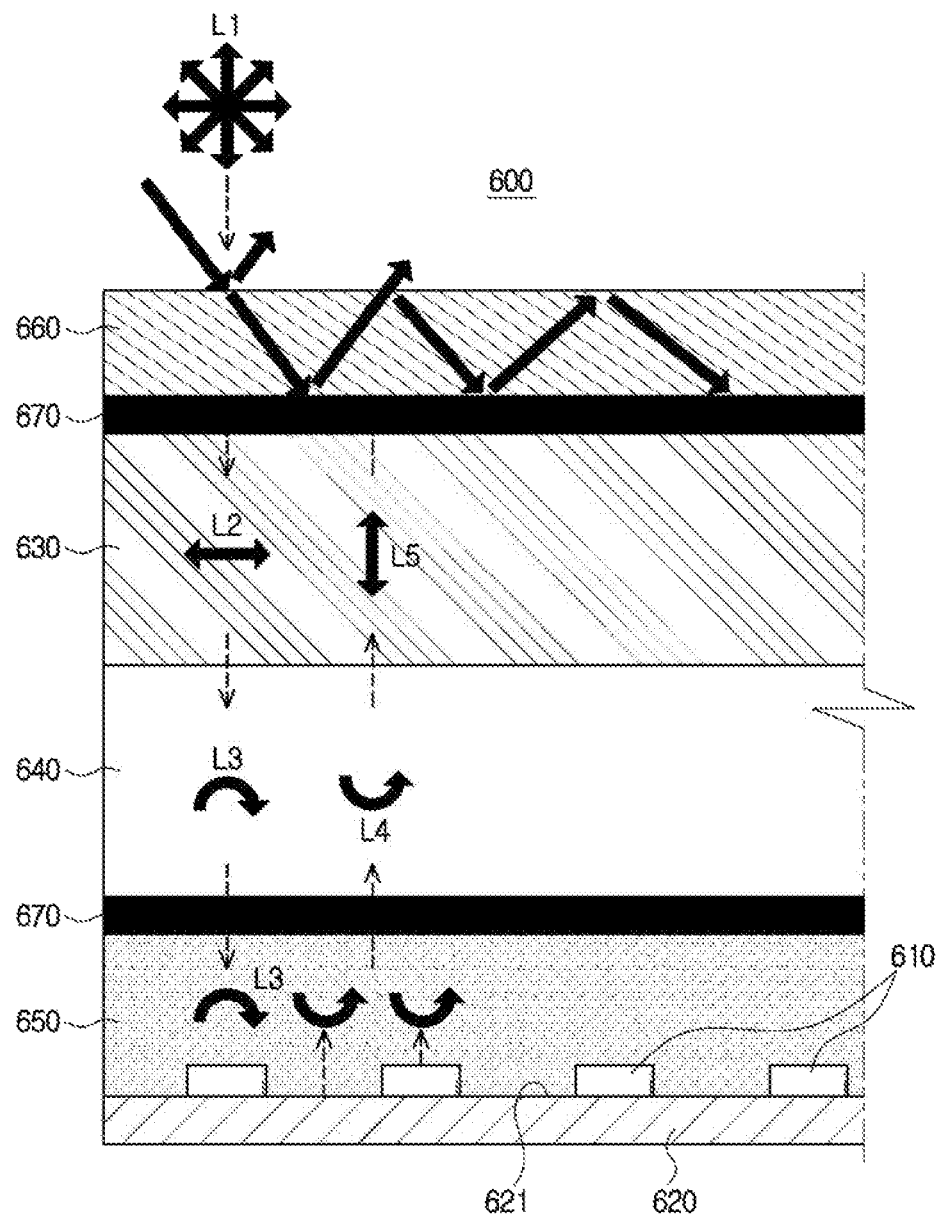
FIG. 8 is a side cross-sectional view illustrating an LED display panel according to the sixth embodiment of the disclosure.

FIG. 8 is a side cross-sectional view illustrating the LED display panel according to the sixth embodiment of the disclosure.

The LED display panel 600 includes a plurality of LED elements 610 mounted on a mounting surface 621 of a substrate 620, and on the mounting surface 621, a transmission layer 650, a circular polarization member 640, and a linear polarization member 630 are sequentially stacked in a direction toward the outside. In addition, the LED display panel 600 may include a low reflection portion 660 arranged on a front surface of the linear polarization member 630 arranged The low reflection portion 660, the linear polarization member 630, the circular polarization member 640, and the transmission layer 650 may be attached and fixed to each other by an optical adhesive. In this case, the optical adhesive includes a material having a black color to lower the reflectance of external light introduced to the inside of the LED display panel 600 so that at least a portion of the external light introduced to the inside of the LED display panel 600 is absorbed by the optical adhesive.

In detail, an adhesive layer 670 formed by an optical adhesive is formed between the low reflection portion 670 and the linear polarization member 630 and between the circular polarization member 640 and the transmission layer 650. The adhesive layer 670 has a black color and thus absorbs at least a portion of external light passing through the adhesive layer 670.

That is, the adhesive layer 670 is provided to contact the low reflection portion 670 and the linear polarization member 630, and the circular polarization member 640 and the transmission layer 650, and to absorb at least a portion of external light passing between the low reflection portion 670 and the linear polarization member 630, and the circular polarization member 640 and the transmission layer 650.

Accordingly, the reflectance of external light of the LED display panel 600 may be lowered, and the black color reproducibility of the LED display panel 600 may be improved.

Hereinafter, a low reflection portion 860 according to another embodiment (the seventh embodiment) of the disclosure will be described. Components except for the low reflection portion 860 described below are the same as the LED display panel 200 of the previous embodiment (the second embodiment) of the disclosure, and thus details of thereof will be omitted.

Figure 9:
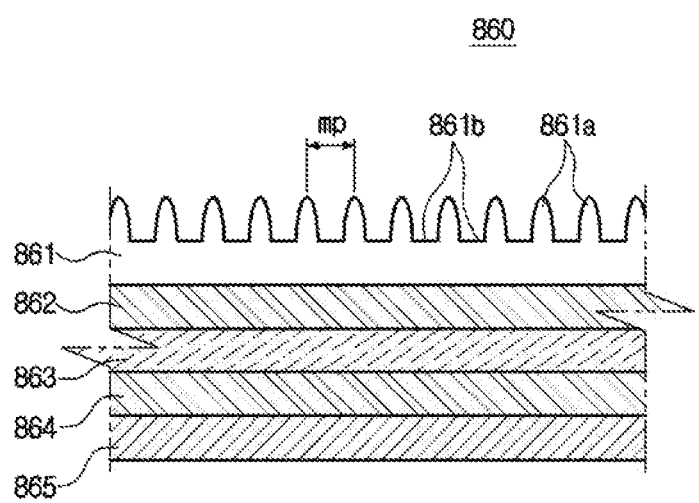
FIG. 9 is a side cross-sectional view illustrating a low reflection portion of an LED display panel according to the seventh embodiment of the disclosure.

FIG. 9 is a side cross-sectional view illustrating an LED display panel according to the seventh embodiment of the disclosure.

The low reflection portion 860 may include a plurality of layers 861, 862, 863, 864, and 865, each having a different refractive index. However, the disclosure is not limited thereto, and the low reflection portion 860 may include layers in a number greater than or less than five.

External light passing through the plurality of layers 861, 862, 863, 864, and 865 is changed in refractive index each time the external light passes through one of the layers 861, 862, 863, 864, and 865, so that the external light is guided to be moved only on the plurality of layers 861, 862, 863, 864, and 865.

A front most layer 861 of the plurality of layers 861, 862, 863, 864, and 865 may include a moth eye pattern. The moth eye pattern has a surface including concave portions 861*b* and convex portions 861*a* of micro units or smaller to form a concave convex structure.

Due to the moth eye pattern formed on the front most layer 861, the refractive index of external light incident on the front most layer 861 is continuously changed by the concave portions 861*b* and the convex portions 861*a* to suppress reflection of the external light. Preferably, a fine pitch (mp) between the concave portion 861*b* and the convex portion 861*a* may be provided in a size shorter than the wavelength of refraction of external light.

Accordingly, when light incident on the low reflection portion 860, the front most layer 861 suppresses at least a portion of the external light from being reflected, thereby reducing the reflectance of the external light itself.

Although the technical spirit of the disclosure have been described through few embodiments above, the scope of the right of the disclosure is not limited thereto, and those skilled in the art will appreciate that various modifications, additions and substitutions are possible, without departing from the scope and spirit of the disclosure as disclosed in the accompanying claims.

MODES OF THE DISCLOSURE

Industrial Applicability

[Sequence Listing Free Text]
The invention claimed is:

1. A display apparatus comprising:
   a substrate;
   a plurality of light emitting device (LED) elements arranged in front of the substrate;
   a transmission layer formed on a front surface of the substrate to entirely cover the plurality of LED elements;
   a first polarization member arranged in front of the transmission layer; and
   a second polarization member arranged on a front surface of the first polarization member and allowing external light to be incident thereon,
   wherein the transmission layer is provided such that polarization of external light polarized through the second polarization member and the first polarization member is maintained in a course of the polarized external light passing through the transmission layer, being reflected by the front surface of the substrate or the plurality of LED elements and being directed to the first polarization member, and
   wherein the transmission layer is provided to surround spaces between the plurality of LED elements.

2. The display apparatus of claim 1, wherein the transmission layer is configured to cover the plurality of LED elements on the front surface of the substrate so that an air layer between the substrate and the first polarization member is not formed.

3. The display apparatus of claim 1, wherein the transmission layer has a thickness that is at least equal to a thickness of the plurality of LED elements.

4. The display apparatus of claim 1, wherein the transmission layer includes an optical adhesive.

5. The display apparatus of claim 1, wherein the transmission layer includes a light absorbing material.

6. The display apparatus of claim 1, wherein the transmission layer has a black color.

7. The display apparatus of claim 1, further comprising a low reflection portion arranged on a front surface of the second polarization member,
   wherein the low reflection portion is configured to guide the external light to be incident on the second polarization member, and prevent the external light incident on the second polarization member and reflected by the front surface of the substrate or the plurality of LED elements from proceeding to an outside of the second polarization member.

8. The display apparatus of claim 7, wherein the low reflection portion includes a plurality of layers, each of the plurality of layers having a different refractive index of light, respectively.

9. The display apparatus of claim 8, wherein a front most layer of the plurality of layers includes a moth eye pattern.

10. The display apparatus of claim 8, further comprising a light absorbing layer arranged between the second polarization member and the low reflection portion, and configured to absorb at least a portion of the external light passing through the low reflection portion.

11. The display apparatus of claim 8, further comprising an optical adhesive layer which is configured to attach the second polarization member to the low reflection portion and has a black color.

12. The display apparatus of claim 1, further comprising an optical adhesive layer configured to attach the first polarization member to the transmission layer and absorb light.

13. The display apparatus of claim 1, further comprising a light absorbing thin film coating layer coated on the front surface of the substrate.

14. The display apparatus of claim 1, wherein the second polarization member is configured to linearly polarize external light and the first polarization member is configured to circularly polarize linear polarization generated by the second polarization member.

* * * * *